(12) United States Patent
Rutherford et al.

(10) Patent No.: US 6,318,124 B1
(45) Date of Patent: Nov. 20, 2001

(54) NANOPOROUS SILICA TREATED WITH SILOXANE POLYMERS FOR ULSI APPLICATIONS

(75) Inventors: Nicole Rutherford, Saratoga; James S. Drage, Fremont; Ron Katsanes, Newark; Hui-Jung Wu, Fremont, all of CA (US); Teresa Ramos, Albuquerque, NM (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/379,484

(22) Filed: Aug. 23, 1999

(51) Int. Cl.[7] ..................................... C03C 17/30
(52) U.S. Cl. ..................... 65/60.8; 65/60.1; 65/60.3; 65/DIG. 11; 427/96; 427/99; 427/165; 427/245; 427/246; 427/269; 427/279; 427/287; 427/407.2
(58) Field of Search .................... 65/60.1, 6.03, 65/60.8, DIG. 11; 427/96, 99, 165, 245, 246, 269, 279, 287, 407.2

(56) References Cited

U.S. PATENT DOCUMENTS

| 3,445,267 | * | 5/1969 | Layne et al. . |
| 6,037,275 | * | 3/2000 | Wu et al. . |
| 6,048,804 | * | 4/2000 | Smith et al. . |
| 6,097,095 | * | 8/2000 | Chung . |

FOREIGN PATENT DOCUMENTS 0775669    5/1999   (EP) .

* cited by examiner

Primary Examiner—Michael Colaianni
(74) Attorney, Agent, or Firm—Roberts & Mercanti, LLP

(57) ABSTRACT

A surface-coated nanoporous silica dielectric film that is prepared by a process comprising the steps of forming a nanoporous silica dielectric coating on a substrate, and coating the formed nanoporous silica dielectric film with a coating composition comprising a polymer precursor, under conditions effective to form a strength-enhancing and/or hydrophobicity enhancing layer on the treated nanoporous silica dielectric film.

19 Claims, No Drawings

NANOPOROUS SILICA TREATED WITH SILOXANE POLYMERS FOR ULSI APPLICATIONS

FIELD OF THE INVENTION

The present invention relates to low dielectric constant nanoporous silica films and to improved processes for producing the same on substrates suitable for use in the production of integrated circuits.

BACKGROUND OF THE INVENTION

As feature sizes in integrated circuits approach 0.25 $\mu$m and below, problems with interconnect RC delay, power consumption and signal cross-talk have become increasingly difficult to resolve. It is believed that the integration of low dielectric constant materials for interlevel dielectric (ILD) and intermetal dielectric (IMD) applications will help to solve these problems.

One material with a low dielectric constant is nanoporous silica, which, as a consequence of the introduction of air, that has a dielectric constant of 1, into the material via its nanometer-scale pore structure, can be prepared with relatively low dielectric constants ("k"). Nanoporous silica is attractive because it employs similar precursors, including organic-substituted silanes, e.g., tetramethoxysilane ("TMOS") and/or tetraethoxysilane ("TEOS"), as are used for the currently employed spin-on-glasses ("SOG") and chemical vapor disposition ("CVD") silica $SiO_2$. Nanoporous silica is also attractive because it is possible to control the pore size, and hence the density, material strength and dielectric constant of the resulting film material. In addition to a low k, nanoporous silica offers other advantages including: 1) thermal stability to 900° C., 2) substantially small pore size, i.e., at least an order of magnitude smaller in scale than the microelectronic features of the integrated circuit), 3) as noted above, preparation from materials such as silica and TEOS that are widely used in semiconductors, 4) the ability to "tune" the dielectric constant of nanoporous silica over a wide range, and 5) deposition of a nanoporous film can be achieved using tools similar to those employed for conventional SOG processing.

Nanoporous silica films have previously been fabricated by a number of methods. For example, nanoporous silica films have been prepared using a mixture of a solvent and a silica precursor, which is deposited on a substrate, e.g., a silicon wafer suitable for producing an integrated circuit, by conventional methods, e,g., including spin deposition, dip-coating, spray deposition, and/or combinations thereof. The substrate optionally has raised lines on its surface and preferably has electronic elements and/or electrical conduction pathways incorporated on or within its surface. The as-spun film is typically catalyzed with an acid or base catalyst and additional water to cause polymerization/gelation ("aging") and to yield sufficient strength so that the film does not shrink significantly during drying.

The internal pore surfaces of previously prepared nanoporous films are formed of silicon atoms which are terminated in a combination of any or all of the following species; silanol (SiOH), siloxane (SiOSi), alkoxy (SiOR), where R is an organic species such as, but not limited to, a methyl, ethyl, isopropyl, or phenyl groups, or an alkylsilane (SiR), where R is as defined previously. When the internal surface of the nanoporous silica is covered with a large percentage of silanols, the internal surface is hydrophilic and may adsorb significant quantities of atmospheric water. Even if the film is outgassed by heating before subsequent processing, the presence of the polar silanols can contribute negatively to the dielectric constant and dielectric loss. Previously employed methods for overcoming this limitation and rendering the internal pore surfaces of nanoporous silica less hydrophilic include reacting the internal surface silanols with surface modifying agents, including, for example, chlorosilanes or disilazanes. These reactions, which may be conducted in either liquid or gas phases, result in a $(SiO)_{4-x}SiR_x$ [wherein x is an integer ranging from 1 to 3] surface which is normally hydrophobic and less polar than the silanol group it replaced.

Unfortunately, previous surface modification methods have capped the polarizable and hydrophilic silanol groups with trimethylsilyl groups and/or other organic and hydrophobic moieties as discussed above, that are too readily oxidized by subsequent processing steps and reagents, leave silanols on the pore surfaces. For example, the fabrication of IC devices typically requires oxidizing plasmas that contact the insulating films with the above-described negative results. Another such oxidizing fabrication process is the chemical vapor deposition ("CVD") of an $SiO_2$ hard mask film onto the work piece. During the deposition of the hard mask the nanoporous silica film can be oxidized and the desired dielectric constant and other electrical properties are lost.

Another problem with nanoporous silica is its low mechanical strength. The low mass density of these materials leads directly to weak mechanical properties, such as modulus and hardness, relative to non-foamed silica films. Various IC fabrication steps, such as chemical mechanical planarization and deposition of conducting metal films, place significant stresses on a nanoporous silica layer, that might cause mechanical failure such as cracking, to occur within the nanoporous silica film.

The difficulties inherent in providing stronger nanoporous silica dielectric films can be appreciated by considering that, for a given dielectric constant (refractive index or density), the density is fixed, at least for a specific chemical composition. At any fixed density, the strength of the nanoporous silica is maximized by having the greatest fraction of solid within the skeleton of the film, rather than as appended surface groups. Thus, for nanoporous silica, the properties of strength and dielectric constant (proportional to material density) can be balanced, in one aspect, by keeping as much of the film mass in the structural elements, and minimizing nonstructural mass, e.g., on the surfaces of the nanometer scale pores.

Thus, for all of these reasons, there remains a need in the art for methods and compositions for producing nanoporous films suitable for the production of integrated circuits that have all of the above-described desirable properties, while minimizing those previously indicated shortcomings of the art.

SUMMARY OF THE INVENTION

In order to solve the above mentioned problems and to provide other improvements, the invention provides new methods for effectively producing low dielectric constant nanoporous silica films having a desired range of dielectric constant significantly lower, or having greater strength at the same dielectric constant, than has previously been obtained, while simultaneously avoiding the shortcomings of previously known methods, while optionally also providing for an enhanced hydrophobic film surface.

Surprisingly, the methods of the present invention are able to achieve this goal by applying an additional layer of polymer precursor, e.g., a silicon-based polymer precursor, onto the formed nanoporous silica dielectric film. Broadly, a siloxane type spin-on-glass precursor or other suitable Si-based polymer precursor is coated onto the nanoporous silica film so that it coats the pore surfaces and/or partially fills the pores. For example, when a siloxane type precursor is employed, it will have a formula that includes Si—R groups, wherein R is H or organic, e.g., $C_1$–$C_4$ alkyl, or optionally aryl. Broadly speaking, as few as 1% or as many as 100% of the Si atoms can have an R group. Optionally, the spin-on-glass precursor or other suitable Si-based polymer precursor is selected to have reactive groups (such as Si—OH or Si—OEt) which will react with silanol groups on the pore surfaces. New Si—O—Si bonds will form as a result of this reaction. The R groups are hydrophobic, and therefore the pores will become hydrophobic.

The coating of polymer film will protect the nanoporous dielectric film from being oxidized by fabrication processes as mentioned above, e.g., by the deposition of a CVD $SiO_2$ film. The lower the proportion of organic moieties on the silylated film surface, the lower the mass associated with the pore surfaces, and therefore a correspondingly reduced film density is achieved. This results in an advantageously reduced dielectric constant, while retaining film mechanical strength.

Accordingly, the invention provides novel processes for forming nanoporous dielectric films or coatings on a desired substrate. Thus, the instant invention provides for a surface-coated nanoporous silica dielectric film that is prepared by forming a nanoporous silica dielectric coating on a substrate, and then coating the formed nanoporous silica dielectric film with a coating composition comprising a polymer precursor, under conditions effective to form a layer on said nanoporous silica dielectric coating.

The nanoporous silica dielectric film can be prepared by any suitable methods, including any art-known method. Simply by way of example, the underlying nanoporous dielectric film can be prepared from a spin-on-glass material comprising at least one compound that includes, e.g., an alkoxysilane, alkylalkoxysilane, a silsesquioxane, a hydrogensiloxane, a hydroorganosiloxane, a hydrogensilsesquioxane, an acetoxysilane, a halogenated silane and combinations thereof.

The coating composition can be any suitable polymer precursor, e.g., a silicon-based polymer precursor such as, for instance, a low organic siloxane, a high organic siloxane, a hydridoorganosiloxane, a poly(arylene ether), a fluorinatated poly(arylene) ether, a polyimide, a polycarbosilane, and combinations thereof.

The invention further provides for integrated circuits, integrated circuit devices, and the like, that include at least one surface-coated nanoporous silica dielectric treated by the processes of the invention, i.e., surface coated by a polymer precursor to provide for enhanced strength and improved hydrophobicity and stable dielectric constant in the presence of atmospheric/environmental moisture.

The invention further provides the methods for preparing these improved nanoporous silica dielectric films by using any suitable art-known method for forming a nanoporous silica dielectric film on a substrate, and then coating the formed nanoporous silica dielectric film with a coating composition comprising a polymer precursor, under conditions effective to form a polymer layer on said nanoporous silica dielectric coating. Supports, including silicon-wafer supports having at least one nanoporous film on its surface that is prepared by the inventive processes are also provided.

DETAILED DESCRIPTION OF THE PREFERRED EMBODIMENT

Accordingly, a number of methods for the preparation of nanoporous silica films on substrates are known to the art, as summarized in the "Description of the Prior Art", above. Such substrates optionally have raised lines on the surface receiving the nanoporous film and preferably are suitable for the production of integrated circuits, e.g., with optional electronic elements and conduction pathways placed under, over and/or adjacent to the nanoporous film. In addition, a number of variations and improvements to these generally known methods for the preparation of nanoporous films are taught by co-owned U.S. patent application Ser. Nos., 09/046,475 and 09/046,473, both filed on Mar. 25, 1998; U.S. patent application Ser. No. 09/054,262, filed on Apr. 3, 1998; and U.S. patent application Ser. Nos. 09/055,244 and 09/055,516, both filed on Apr. 6, 1998, the disclosures of which are incorporated by reference herein in their entireties. In addition, co-owned U.S. patent application Ser. No. 09/291,510, filed on Apr. 14, 1999, describes additional improved methods of forming nanoporous dielectric films by, e.g., thermal degradation of a film component during heating of the formed film.

In order to better appreciate the scope of the invention, it should be understood that unless the "$SiO_2$" functional group is specifically mentioned when the term "silica" is employed, the term "silica" as used herein, for example, with reference to dielectric films, is intended to refer to dielectric films prepared by the inventive methods from an organic or inorganic glass base material, e.g., any suitable silicon-based material. In addition, it should also be understood that the use of singular terms herein is not intended to be so limited, but, where appropriate, also encompasses the plura, e.g., exemplary processes of the invention may be described as applying to and producing a "film" but it is intended that multiple films can be produced by the described, exemplified and claimed processes, as desired. Further, the use of the terms, "agent" or "agents" herein should be considered to be synonymous with the terms, "reagent" or "reagents," unless otherwise indicated.

Nanoporous silica films formed on a substrate for use according to the invention are generally formed with a porosity of about 50% or greater, and for example, with pore sizes that range from about 1 nm to about 100 nm, more preferably from about 2 nm to about 30 nm, and most preferably from about 3 nm to about 20 nm. The density of the silicon containing composition, including the pores, ranges from about 0.1 to about 1.9 g/cm$^3$, more preferably from about 0.25 to about 1.6 g/cm$^3$, and most preferably from about 0.4 to about 1.2 g/cm$^3$. The protective Si-based polymer coatings according to the invention provide for enhanced hydrophobicity and mechanical strength. Thus, surface protected nanoporous dielectric films according to the invention can also be characterized as exhibiting the following additional measured properties; Si—H bond absorbance at 2150 cm$^{-1}$ measured by Fourier transform infrared spectroscopy, a stud pull strength ranging from about 1.5 kpsi to about 6 kpsi, and it is confirmed, e.g., by electron microscopy, that the pore structures remain open.

Preferably, the nanoporous silica films produced by the processes of the invention preferably have a moisture stable dielectric constant that is less than about 3. More preferably, the nanoporous silica films of the invention have a dielectric constant ranging from about 1.1 to about 3.0, even more preferably from about 1.3 to about 3.0, and most preferably from about 1.5 to about 2.5. Further, nanoporous silica films prepared according to the invention are preferably hydrophobic at ambient temperatures; preferably have a thickness ranging from about 0.1 to about 3 microns and are preferably deposited on either plain (blank) or patterned substrates suitable for the production of integrated circuits.

Forming a Nanoporous Dielectric Film on a Substrate

Broadly, the first step of the inventive process forms a reaction product of at least one alkoxysilane, a solvent composition, optional water and an optional catalytic amount of an acid or base, as described, for example, by co-owned U.S. patent application Ser. Nos. 09/054,262, filed on Apr. 3, 1998 and 09/111,083, filed on Jul. 7, 1998, the disclosures of which are incorporated by reference herein in their entirety.

Water is included to provide a medium for hydrolyzing the alkoxysilane. Preferably the solvent composition comprises at least one relatively high volatility solvent and at least one a relatively low volatility solvent. This reaction product is applied onto a substrate, the high volatility solvent evaporates during and immediately after deposition of the reaction product. The reaction product is hydrolyzed and condensed until it forms a gel layer, which is then cured, generally by the application of heat.

Precursors

Any material suitable for use as a spin-on-glass (SOG) can be used to prepare a ananoporous silica dielectric film by art known methods. Art-known classes of SOG compounds include, simply by way of example, alkoxysilanes, alkylalkoxysilanes, silsesquioxanes, a hydrogensiloxanes, a hydroorganosiloxanes, hydrogensilsesquioxanes, an acetoxysilanes, halogenated silanes, to name but a few, as well as derivatives and combinations thereof.

In a preferred embodiment, useful alkoxysilanes nonexclusively include those described by Formula I:

Formula I

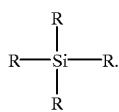

In Formula I, at least 2 of the R groups are independently $C_1$ to $C_4$ alkoxy groups and the balance, if any, are independently selected from the group consisting of hydrogen, alkyl, phenyl, halogen, substituted phenyl. Alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

The alkoxysilane component of the liquid precursor solution that is applied to the substrate is preferably present in an amount of from about 3% to about 50% by weight of the overall blend. A more preferred range is from about 5% to about 45% and most preferably from about 10% to about 40%. The mole ratio of water to silane is preferably from about 0 to about 50. A more preferred range is from about 0.1 to about 10 and most preferably from about 0.5 to about 1.5.

The silica precursor can be any or a combination of alkoxysilanes such as tetraethoxysilane, tetrapropoxysilane, tetraisopropoxysilane, tetra(methoxyethoxy)silane, tetra (methoxyethoxyethoxy)silane which have four groups which may be hydrolyzed and than condensed to produce silica, alkylalkoxysilanes such as methyltriethoxysilane, arylalkoxysilanes such as phenyltriethoxysilane and precursors such as triethoxysilane which yield SiH functionality to the film. Tetrakis(methoxyethoxyethoxy)silane, tetrakis(ethoxyethoxy)silane, tetrakis(butoxyethoxyethoxy) silane, tetrakis(2-ethylthoxy)silane, tetrakis (methoxyethoxy)silane, and tetrakis(methoxypropoxy) silane can also be optionally employed.

Additionally, partially hydolyzed, condensed or polymerized derivatives of these species can be optionally employed to produce nanoporous dielectric films. Other precursors of utility to this invention could include precursors which can be thermally or photolytically crosslinked. In general, the precursors can be gases, liquids or solids at room temperature.

Solvents

The silica precursor composition may optionally comprise a solvent composition, water and/or a catalytic amount of an acid. Water provides a medium for hydrolyzing the alkoxysilane. Preferably the solvent composition can comprises a relatively high volatility solvent or a relatively low volatility solvent. A relatively high volatility solvent is one which preferably has a boiling point of about 120° C. or less, preferably about 100° C. or less.

A relatively high volatility solvent preferably has a boiling point of about 120° C. or less, preferably about 100° C. or less and include, for example, methanol, ethanol, n-propanol, isopropanol, n-butanol and mixtures thereof, as well as others that can be readily determined by those skilled in the art.

A relatively low volatility solvent composition is one which evaporates at a temperature above, preferably significantly above, that of the relatively high volatility solvent, e.g., having a boiling point of about 175° C. or higher, more preferably about 200° C. or higher, and include, for example, alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof, as well as others that can be readily determined by those skilled in the art.

The solvent component is preferably present in an amount of from about 20% to about 90% by weight of the overall blend. A more preferred range is from about 30% to about 70% and most preferably from about 40% to about 60%. When both a high and a low volatility solvent are present, the high volatility solvent component is preferably present in an amount of from about 20% to about 90% by weight of the overall blend. A more preferred range is from about 30% to about 70% and most preferably from about 40% to about 60%. When both a high and a low volatility solvent are present, the low volatility solvent component is preferably present in an amount of from about 1 to about 40% by weight of the overall blend. A more preferred range is from about 3% to about 30% and most preferably from about 5% to about 20%.

Catalysts

Optional acid catalyst drives the reaction of the alkoxysilane with the relatively high volatility solvent, a relatively low volatility solvent and water. Suitable acids are nitric acid and compatible organic acids which are volatile, i.e., which evaporate from the resulting reaction product under the process operating conditions, and which do not introduce impurities into the reaction product.

The acid is present in a catalytic amount which can be readily determined by those skilled in the art. Preferably the molar ratio of acid to silane ranges from about 0 to about 0.2, more preferably from about 0.001 to about 0.05, and most preferably from about 0.005 to about 0.02.

Substrates

The alkoxysilane containing composition is then coated on a substrate by any suitable art known method, including application by spinning, dipping or brushing to form a dielectric film on the substrate surface. Typical substrates are those suitable to be processed into an integrated circuit or other microelectronic device and are in the form of a wafer. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. The substrate optionally has a pattern of lines on it surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

Aging or Gelling of the Film

One method that is employed for starting gelation of the applied film is to place the coated substrate wafer into a sealed chamber that is rapidly evacuated to a vacuum. Preferably, the pressure of the evacuated chamber ranges from about 0.001 torr to about 0.1 torr. Then the coating is sequentially exposed to both a water vapor and a base vapor. For purposes of this invention, a base vapor includes gaseous bases. Preferably the coating is first exposed to a water vapor and then exposed to a base vapor, however, in an alternate embodiment, the coating may first be exposed to a base vapor and then a water vapor. The first of the two exposures is conducted such that thereafter the pressure in the chamber remains at sub-atmospheric pressure. The second exposure may be conducted at atmospheric pressure, sub-atmospheric pressure or super-atmospheric pressure. Art-known variations on this scheme may also be readily applied by the artisan.

Suitable bases for use in the base vapor nonexclusively include ammonia and amines, such as primary, secondary and tertiary alkyl amines, aryl amines, alcohol amines and mixtures thereof which have a boiling point of about 200° C. or less, preferably 100° C. or less and more preferably 25° C. or less and are employed in a mole ratio of water vapor to base vapor that ranges from about 1:3 to about 1:100. Preferred amines are methylamine, dimethylamine, trimethylamine, n-butylamine, n-propylamine, tetramethyl ammonium hydroxide, piperidine and 2-methoxyethylamine. The ability of an amine to accept a proton in water is measured in terms of the basicity constant $K_b$, and $pK_b = -\log K_b$. In the preferred embodiment, the $pK_b$ of the base may range from about less than 0 to about 9. A more preferred range is from about 2 to about 6 and most preferably from about 4 to about 5.

The water vapor causes a continued hydrolysis of the alkoxysilane alkoxy groups, and the base catalyzes condensation of the hydrolyzed alkoxysilane and serves to increase molecular weight until the coating gels and ultimately increases gel strength. The film is then dried in a conventional way by solvent evaporation of the less volatile solvent. Elevated temperatures may be employed to dry the coating in this step. Such temperatures may range from about 20° C. to about 450° C., preferably from about 50° C. to about 350° C. and more preferably from about 175° C. to about 320° C.

After the desired time of reaction after base addition, on the order of seconds to a few minutes, the chamber pressure is brought to atmospheric pressure. This can be accomplished by either adding an inert gas such as nitrogen and opening the chamber or evacuating the base/water mixture via vacuum and backfilling with an inert gas. As a result, a relatively high porosity, low dielectric constant, silicon-containing polymer composition forms on the substrate.

Surface Treatment/Solvent Exchange

Optionally, the gelled nanoporous silica dielectric film is treated with a surface modification agent or agents selected to cap or silylate undesirable silanol groups on the pore surfaces. A number of methods are known to the art for such surface modification processes, including those described by co-owned U.S. application serial No. 09/235,186, filed on Jan. 22, 1999, the disclosure of which is incorporated herein in its entirety. Generally, the film is reacted with one or more monofunctional and/or a multifunctional surface modification agents under conditions, and for a time period, that is effective to allow penetration of the agent into the porous film surface and to silylate a substantial proportion of any free silanol groups on the surfaces of the nanometer scale pores. A suitable silylation agent is infiltrated in liquid/solution and/or vapor form into the nanoporous surface under condition that allow the agent to silylate or cap the silanol groups on the pore surfaces, and it is then evaporated or driven off by heat. Suitable monofunctional agents, to name but a few, include, hexamethyldisilazane (HMDZ), methyltracetoxy (MTAS) in a compatible solvent or co-solvent, e.g., a ketone co-solvent such as 3-pentanone or a suitable non-ketone solvent or co-solvent or even in vapor form, with or without a suitable co-solvent.

Suitable multifunctional surface modification can be selected from compounds having formulas that include, e.g., $R_1Si(OR_2)_3$; $R_1Si(NR_2R_3)_3$; $R_1Si(ON=CR_2R_3)_3$; $R_1SiCl_3$; and $R_1{}_xSi(OCOR_2)_y$ and combinations thereof. $R_1$, $R_2$ and $R_3$ are independently H, alkyl, aryl, and x is an integer ranging in value from 1 to 2, and y is an integer ranging in value from 2 to about 3, and x and y are the same or different. Preferably, the alkyl moiety is substituted or unsubstituted and is selected from a group that includes straight alkyl, branched alkyl, cyclic alkyl and combinations thereof, and wherein the alkyl moiety ranges in size from $C_1$ to about $C_{18}$. In another preferred embodiment, the aryl moiety is substituted or unsubstituted and ranges in size from $C_5$ to about $C_{18}$. Preferred multifunctional surface modification agents include, e.g., an alkylsilane, an arylsilane, an alkylacetoxysilane, and arylacetoxysilane and combinations thereof. Specific multifunctional agents include, e.g., methyltrimethoxysilane, tris(dimethylamino)methylsilane, tris(dimethylamino)phenylsilane, and/or tris (dimethylamino)silane, methyltris(methylethylkeoxime) silane, methyltrichlorosilane, methyltriacetoxysilane, dimethyldiacetoxysilane, phenyltriacetoxysilane, methyltrimethoxysilane, diphenyldiacetoxysilane and combinations thereof In brief, other surface modification agents that can be employed, in either vapor phase and/or solution based processes of the invention, include, but are not limited to: trimethylethoxysilane, trimethylmethoxysilane, 2-trimethylsiloxypent-2-ene-4-one, n-(trimethylsilyl) acetamide, 2-(trimethylsilyl) acetic acid, n-(trimethylsilyl)

imidazole, trimethylsilylpropiolate, trimethylsilyl (trimethylsiloxy)-acetate, nonamethyltrisilazane, hexamethyldisilazane, hexamethyldisiloxane, trimethylsilanol, triethylsilanol, triphenylsilanol, t-butyldimethylsilanol, diphenylsilanediol, and combinations thereof.

Other useful surface modification agents include, but are not limited to, alkylacetoxysilane or arylacetoxysilane compound, e.g., acetoxysilane, acetoxytrimethylsilane, methyltriacetoxysilane, phenyltriacetoxysilane, diacetoxydimethylsilane, diacetoxydiphenylsilane, hexamethyldisilazane and combinations of these and/or in combination with any of the foregoing surface modification agents.

Surface modification agents can optionally be applied in liquid or vapor phase in combination with one or more co-solvents and/or co-reactants, e.g., including but not limited, ketone co-solvents or co-reactants. Simply by way of example, the co-reactants and/or co-solvents are selected from among the following compounds: acetone, 2-butanone, 2-pentanone, 3-pentanone, 2,4-dimethyl-3-pentanone, cyclopentanone, cyclohexanone, cyclopentanone, diisopropylketone, 2,4-pentanedione, dioxane, n-butanol, 2-pentanol, 1,2-diaminopropane, 1-dimethylamino-2 propanone, water, and combinations thereof. Any suitable non-ketone solvent or co-solvent can also be employed, including, but not limited to, ethers, esters, ketones, glycol ethers, chlorinated solvents, low viscosity siloxanes and suitable combinations thereof.

In co-owned U.S. provisional patent application serial No. 60/117,248, filed on Jan. 26, 1999, the disclosure of which is incorporated by reference herein in its entirety, methods for providing desirable surface modifications and enhanced mechanical properties to nanoporous dielectric films by applying certain water-polymerized SOG type-materials to such films are described. Polymer precursors, i.e., monomers useful in this polymer coating process include, simply by way of example siloxanes, a silazanes, silanes, and combinations thereof.

Curing

After drying, the films are cured. Generally, curing may be done by any means known in the art. Typically the dielectrics are cured by heating to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven by the application of heat for a sufficient time and at a sufficient temperature to cure the dielectric films. Heating is preferably conducted at a temperature of from about 200° C. to about 600° C., and more preferably from about 350° C. to about 450° C. This heating is preferably performed from about 1 minute to about 360 minutes, and more preferably from about 2 to about 60 minutes.

Preferably, the treated film is first dried, i.e., baked, and then cured. The baking steps are accomplished by heating in air for one or more time periods, ranging from about 5 seconds to about 10 minutes each, but preferably for about 1 minute for each heat treatment. The heating steps serve to drive remaining reactant or solvent, e.g., surface modification agent and/or solvent and/or cosolvent, left over from the reaction step, out of the nanoscale pores. The number of heat treatments generally ranges from about 1 to about 5, but preferably two heat treatments are conducted, second heat treatment at a higher temperature than the first to ensure removal of the agent, while minimizing thermal stress on the film. The heat treatment is generally conducted at temperatures ranging from about 100 through about 400° C., or greater, and more preferably from about 150 to about 350° C. In particular, the first heat treatment is preferably conducted at a temperature ranging from about 150 to 200° C., and the second heat treatment is preferably conducted at a temperature ranging from about 250 to about 350° C., and completes the curing process.

Optionally the dielectrics may be cured by electron beam exposure or by exposure to actinic light, such as UV light, to increase its molecular weight. Suitable electron active beam chambers are commercially available from Electron Vision, a unit of AlliedSignal Inc., under the trade name "ElectronCure™". The principles of operation and performance characteristics of such device are described in co-owned U.S. Pat. No. 5,003,178, the disclosure of which is incorporated herein by reference in its entirety.

The forgoing description nonexclusively describes the preparation of a nanoporous silica dielectric film on a substrate, e.g., a substrate suitable for preparing an IC device. The artisan will appreciate that other art-known methods for forming a nanoporous silica dielectric film on a substrate may be readily substituted, and the methods of the invention applied thereto.

Polymer Overcoat

Surprisingly, the present invention provides a wide range of suitable polymer or silicon-based SOG substrates, and methods of applying these to nanoporous silicica dielectric films, in order to achieve enhanced mechanical strength, and/or optional improvements in film surface hydrophobicity. Thus, according to the invention, a suitable polymer or silicon-based SOG substrate or polymer precursor, simply by way of example, a low organic siloxane, a high organic siloxane, a hydridoorganosiloxane, a poly(arylene ether), a fluorinatated poly(arylene) ether, a polyimide, a polycarbosilane, and combinations thereof, is then applied over the nanoporous dielectric film coating. The area covered can be the entire substrate surface, or selected areas, depending upon the requirements of fabrication.

Accordingly, the dielectric nanoporous silica film, as described above, is applied to the substrate and cured. In another embodiment of the invention, the nanoporous dielectric silica film is applied to the substrate and then the silicon-based polymer precursor is applied to the first dielectric composition film, and then both films are cured together.

Curing may be conducted by any of the methods described above for curing a nanoporous dielectric film, but is preferably conducted at a temperature sufficient to drive out any remaining solvent and to polymerize the selected Si-based coating material(s) and to generate the desired surface chemistry, e.g., crosslinking to provide added strength and optionally, added Si—H and/or Si—C groups on the nanometer scale pore surfaces of the treated nanoporous dielectric film are also provided. More preferably, the applied Si-based coating is heated under air in a series of graded steps, in air, to drive out remaining solvent at temperatures ranging from about 70 through about 250 degrees C., or greater, for time increments ranging from about 30 seconds to about 5 minutes, or more. The substrate bearing the dried Si-based coating is then preferably baked in an oven under an inert atmosphere, e.g., $N_2$ gas, at a temperature ranging from about 350 to about 450 degrees C., for a time period ranging from about 15 to about 45 minutes, or longer, until cured.

The silicon-based polymer precursor to be used as an overcoating or protective coating may be applied onto the nanoporous dielectric silica film by any means, including, for example, the conventional coating methods, e.g., spin-coating, mentioned above. The thickness of the applied silica-based polymer will vary depending on the amount of liquid polymer precursor that is applied to the substrate.

Simply by way of example, a polymer precursor suitable for forming overcoated Si-based polymer layer is dispersed in a compatible solvent and applied onto nanoporous silica dielectric film. Suitable solvent compositions include those which have a boiling point of about 120° C. or less, preferably about 100° C. or less. Suitable high volatility solvent compositions nonexclusively include methanol, ethanol, n-propanol, isopropanol, n-butanol, propyl acetate and mixtures thereof. Other relatively high volatility solvent compositions which are compatible with the other ingredients can be readily determined by those skilled in the art. The solvent is preferably present in an amount of from about 10% to about 90% by weight of the overall blend, more preferably from about 15% to about 80% and most preferably from about 40% to about 60% by weight of the overall blend with the polymer.

High Or Low Organic Siloxane

The added silicon-based polymer layer or layers preferably comprise a polymer having a structure of I or II. Polymers having the structure I are of low organic content, e.g., where the carbon containing substituents are present in an amount of less than about 40 mole percent. These polymers are described more fully in U.S. patent application Ser. No. 09/044,831, filed Mar. 20, 1998, which is incorporated herein by reference.

Formula 2–5 are as follows and include siloxane polymers having the structure:

$[H\text{—}SiO_{1.5}]_n[R\text{—}SiO_{1.5}]_m,$      Formula 2

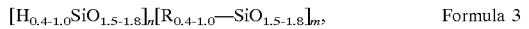
$[H_{0.4-1.0}SiO_{1.5-1.8}]_n[R_{0.4-1.0}\text{—}SiO_{1.5-1.8}]_m,$      Formula 3

$[H_{0-1.0}\text{—}SiO_{1.5-2.0}]_n[R\text{—}SiO_{1.5}]_m,$      Formula 4

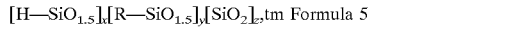
$[H\text{—}SiO_{1.5}]_x[R\text{—}SiO_{1.5}]_y[SiO_2]_z,$ Formula 5 wherein the sum of n and m, or the sum or x, y and z is from about 8 to about 5000, and m and y are selected such that carbon containing substituents are present in an amount of less than about 40 mole percent. R, is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. In a preferred embodiments the mole percent of carbon containing substituents is in the range of from about 15 mole percent to about 25 mole percent. A suitable low organic content polymer precursor is available commercially as LOSP™ (AlliedSignal at Santa Clara, Calif.).

In another embodiment of the invention, the added silicon-based polymer layer or layers may comprise polymers that are of high organic content, e.g., wherein the carbon containing substituents are present in an amount of about 40 mole percent or more. These polymers are described more filly in co-owned U.S. patent application Ser. No. 09/044,798, filed Mar. 20, 1998, which is incorporated herein by reference. Such have the formulae 6–9:

$[HSiO_{1.5}]_n[RSiO_{1.5}]_m,$      (Formula 6)

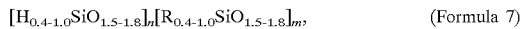
$[H_{0.4-1.0}SiO_{1.5-1.8}]_n[R_{0.4-1.0}SiO_{1.5-1.8}]_m,$      (Formula 7)

$[H_{0-1.0}SiO_{1.5-2.0}]_n[RSiO_{1.5}]_m,$      (Formula 8)

wherein the sum of n and m is from about 8 to about 5000 and m is selected such that the carbon containing substituent is present in an amount of from about 40 Mole percent or greater; and

$[HSiO_{1.5}]_x[RSiO_{1.5}]_y[SiO_2]_z,$      (Formula 9)

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. A suitable high organic content polymer precursor is available commercially as HOSP™ (AlliedSignal at Santa Clara, Calif.).

Polymers of the structures 2–9 may be prepared by mixing a solution of at least one organotrihalosilane and hydridotrihalosilane to form a mixture; combining the mixture with a dual phase solvent which includes both a non-polar solvent and a polar solvent; adding a catalyst to the dual phase solvent and trihalosilane mixture, thus providing a dual phase reaction mixture; reacting the dual phase reaction mixture to produce an organohydridosiloxane; and recovering the organohydridosiloxane from the non-polar portion of the dual phase solvent system. Additional information on preparation of these polymers is provided by co-owned U.S. patent application Ser. No. 09/328,648, filed on Jun. 9, 1999, the disclosure of which is incorporated by reference herein in its entirety.

Hydroorganosiloxanes

The hydroorganosiloxanes and mixtures thereof are preferred. Preferred siloxane materials suitable for use in this invention are commercially available from AlliedSignal Inc. under the tradename Purespin®. Also useful are methylated siloxane polymers available from AlliedSignal Inc. under the tradenames Acuglass T11, T12 and T14™ and Accuspin® T18, T23 and T24. In particular, the 111 and 311 members of the Accuglass T11 series are exemplified as described below.

Poly(Arylene Ether or Fluorinated Poly(Arylene Ether

In another preferred embodiment, the polymer is a preformed poly(arylene ether) or fluorinated poly(arylene ether. Polymers or pre-polymers in a monomeric state or oligomeric state may be formed on the substrate with subsequent polymerization. Suitable poly(arylene ethers) or fluorinated poly(arylene ethers) are known in the art from U.S. Pat. Nos. 5,155,175; 5,114,780 and 5,115,082, the disclosure of which are incorporated by reference herein. Preferred poly(arylene ethers) and fluorinated poly(arylene ethers) are disclosed in U.S. patent application Ser. No. 08/990,157 filed Dec. 12, 1997 which is incorporated herein by reference. A preferred example of this type of polymer precursor is commercially available as Flare™ (AlliedSignal, Santa Clara, Calif.).

Polycarbosilanes

In another optional embodiment, the dielectric films of the invention are coated with one or more additional layers formed from polycarbosilanes having one or more of the following formulas

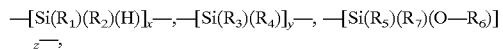
$-\!\![Si(R_1)(R_2)(H)]_x\!-\!,\!-\!\![Si(R_3)(R_4)]_y\!-\!,\,-\!\![Si(R_5)(R_7)(O\!-\!R_6)]_z\!-\!,$ and/or

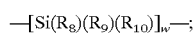
$-\!\![Si(R_8)(R_9)(R_{10})]_w\!-\!;$ wherein

R$_1$, R$_7$ and R$_{10}$ is each independently an alkylene, cycloalkylene and arylane group, that can be substituted or unsubstituted, R$_2$, R$_3$, R$_4$, R$_5$ and R$_6$ are each independently an H or organic group, R$_6$ can be an organosilicon, a silanyl, a siloxy, and an organo group; and x, y, z and w when added together are greater than 10 and less than 100,000, which may be expressed as: 10<x+y+z+w<100,000, and y and z and w can collectively or independently be zero.

Oxygen Plasma-Resistant Hydridosiloxanes

In yet another optional embodiment, the dielectric films of the invention are coated with one or more additional layers formed from polymers of Formula 10, that are useful to provide oxygen plasma resistant dielectric films and coatings to facilitate further processing of the desired integrated circuit device. It should be emphasized that the property of oxygen plasma resistance is not the primary property provided by employing these types of polymer precursors. Simply by way of example, these types of polymers are employed in the present invention to provide added mechanical strength the nanoporous dielectric type films.

(Formula 10)

wherein R is a mixture of H and an alkyl group having between 1 and 4 carbon atoms; a+b+c=1; 0.5<a<0.99; 0.01<b<0.5; and 0<c<0.5. Preferably, a and b are zero, and Formula 11 provides for an oxygen plasma resistant hydridosilsesquioxane.

Methods of preparing these compounds are described, by U.S. Pat. No. 5,153,295, the disclosure of which is incorporated by reference herein in its entirety. In brief, such polymers may be prepared from, for example, trialkoxysilane or tetraalkoxysilane or mixtures thereof, as starting materials, using either plastic reaction vessels or glass vessels pre-treated to reduce trace metal contamination. Such pretreatments are known in the art. In some embodiments, triethoxysilane (HTEOS) is the starting material. A reaction vessel is charged with HTEOS and an aprotic solvent, for example, acetone, to provide a reaction mixture. Other aprotic solvents such as ethyl acetate, n-propyl acetate, or tetrahydrofuran are alternatively employed. An acid/water mixture, e.g., nitric acid and water, is added dropwise to the reaction mixture while stirring. Other acids, such as acetic, formic, or phosphoric acid are alternatively used. Optionally, the reaction mixture is maintained at a temperature below 20° C. during the acid/water mixture addition. Once addition of the acid/water mixture is complete, the resulting solution is heated to reflux for between approximately 6 and 9 hours to produce a solution of poly (hydrido siloxane) copolymer in accordance with Formula 11.

Alternatively, the synthesis is conducted at room temperature. A plastic vessel is charged with HTEOS, water, acid, and an aprotic solvent and the reaction mixture is stirred at room temperature (21° C.) for approximately 3 days to 14 days to provide a solution of poly (hydrido siloxane) copolymer in accordance with Formula 11. Further details for the preparation and characterization of polymers according to Formula 11 are found in co-owned U.S. Ser. No. 09/039,289, filed on Mar. 12, 1998, the disclosure of which is incorporated by reference herein in its entirety.

The following non-limiting examples serve to further explain and illustrate the invention.

EXAMPLE 1

This example demonstrates the preparation of a nanoporous film coated with hydridopolycarbosilane ("HPCS"), an Si-based polymer, to provide improvements including enhanced mechanical strength.

A nanoporous silica precursor was synthesized by adding 208 mL of tetraethoxysilane, 94 mL of triethyleneglycol monomethyl ether (TriEGMME), 16.8 mL deionized water, and 0.68 mL of 1N nitric acid together in a round bottom flask. This solution was heated to about 80° C. with vigorous stirring. After it was refluxed for 1.5 hours to form a clear solution, this solution was allowed to cool down to room temperature. Then it was diluted 25% by weight with ethanol and filtered through 0.1 micron Teflon™ filter.

About 2 mL of the nanoporous silica precursor was deposited onto a 4" silicon wafer and then spun at 2500 rpm for 30 seconds. Then the film was gelled/aged in a vacuum chamber using the following conditions:
1. The chamber was evacuated to 250 torr.
2. 15M ammonium hydroxide was heated and equilibrated at 45° C. and introduced into the chamber to increase the pressure to 660 torr for 10 minutes.
3. The chamber was refilled with air and the film was removed from the chamber for next step surface treatment/solvent exchange.

Surface Treatment/Solvent Exchange of Nanoporous Film

Next the aged film was subjected to surface treatment/solvent exchange. The solution used for surface treatment/solvent exchange was prepared by dissolving methyltracetoxy (MTAS) in 3-pentanone (Pacific Pac International Inc., Hollister, Calif.) to make 5wt. % MTAS concentration in 3-pentanone. MTAS was purchased from United Chemical Technologies, Inc (Bristol, Pa.) and distilled prior to use. The surface treatment/solvent exchange of the film was carried out using the following conditions:
1. The reagent used for the surface treatment was prepared by as described above.
2. The aged film was put on the spinning chuck and spun at 250 rpm.
3. About 30 mL of the above MTAS solution was spun on the film without allowing the film to dry for 20 seconds.
4. Then the film was spun dry at 2500 rpm for 10 second and the film was removed from the chuck and subjected to heat treatment. The film obtained from the above process was then heated (cured) at 175 and 320° C. under air for 60 seconds respectively.

Polymer Treatment

The above-prepared baked film was subjected to the Si-based polymer solution treatment. The Si-based polymer solution was prepared by dissolving 5 g of hydridopolycarbosilane (Starfire Inc, Watervliet, N.Y.) in 95 grams of 3-pentanone.
1. The baked film was put on the spinning chuck and spun at 2500 rpm for 30 seconds.
2. About 2 mL of the above Si-based polymer solution was dispensed on the film.
3. Then the film was spun at 250 rpm for 2 second and then raised the spin speed to 3000 rpm and spun for 20 seconds. The film obtained from the above process was then heated at 80, 150 and 250° C. under air for 60 seconds respectively. Then it was cured in a furnace at 400° C. for 30 minute under nitrogen.

Dielectric Constant Measurement

The dielectric constant of the produced films were measured by the standard CV curve technique, using MOS capacitor ("MOSCAP") structure as follow. A MOSCAP structure was formed by sputtering aluminum onto the film through a circular dot mask and an aluminum blanket film was sputtered onto the back side of the wafer. An appropriately biased voltage was applied to the MOSCAP and the capacitance was then measured at 1 MHz. This method was employed for dielectric constant measurement in all subsequent examples.

Film Mechanical Strength Measurement

The cohesive strength of the film was measured by stud pull test. The film to be tested was placed on substrate wafer and an aluminum layer was placed on top of the film to prevent penetration of the epoxy into pore structure by the subsequently applied epoxy. An epoxy test stud was then epoxied to the top of the aluminized film. Once the epoxy was cured, the stud was pull away from the film until some component broke. The measured pull force at the moment just prior to breakage was reported as the stud pull strength measured in kilopounds per square inch (KPSI)

TABLE 1

| Dielectric constant | Stud pull (KPSI) |
| --- | --- |
| 2.0 | 2.18 |

With testing by Fourier transform infrared ("FT-IR") spectrograph (not shown), it was confirmed that the treatment of the nanoporous silica dielectric film with HPCS lead to inclusion of HPCS into nanoporous silica as indicated by the presence of Si—H bond absorbance at 2150 cm$^{-1}$ and lower silanol content compared to film without this treatment. Scanning electronic microscopy (SEM) was used to observe the cross-section of the film. SEM indicated that a thin layer was formed on top of the nanoporous silica film and the nanoporous silica remained porous. The dielectric constant measured for this film show that the low dielectric constant of the formed film is maintained while the improvement of mechanical properties was achieved. The improvement of stud pull strength (2.18 kpsi) was illustrated when compared to Example 2, below, where the stud pull strength was determined to be 0.31 kpsi.

EXAMPLE 2

Comparative example. This sample demonstrates that nanoporous silica films treated with MTAS alone have lower mechanical strength relative to polymer-coated nanoporous dielectric films.

A nanoporous silica precursor was synthesized by adding 208 mL of tetraethoxysilane, 94 mL of triethyleneglycol monomethyl ether(TIEGMME), 16.8 mL deionized water, and 0.68 mL of 1N nitric acid together in a round bottom flask. This solution was heated to about 80° C. with vigorous stirring. After refluxed for 1.5 hours to form a clear solution, this solution was allowed to cool down to room temperature. Then it was diluted 25% by weight with ethanol and filtered through 0.1 micron Teflon™ filter.

About 2 mL of the nanoporous silica precursor was deposited onto a 4" silicon wafer and then spun at 2500 rpm for 30 seconds. Then the film was gelled/aged in a vacuum chamber using the following conditions:

1. The chamber was evacuated to 250 torr.
2. 15M ammonium hydroxide was heated and equilibrated at 45° C. and introduced into the chamber to increase the pressure to 660 torr for 4 minutes.
3. The chamber was refilled with air and the film was removed from the chamber for next step surface treatment/solvent exchange.

The surface treatment/solvent exchange of the film was carried out using the following conditions:

1. The reagent used for the surface modification was prepared by mixing 5 grams of methyltriacetoxysilane (MTAS) (Gelest, Tullytown, Pa. 19007) with 95 grams of 3-pentanone to form a clear colorless solution.
2. The aged film was put on the spinning chuck and spun at 250 rpm.
3. About 30 mL of the above MTAS solution was spun on the film without allowing the film to dry for 20 seconds.
4. Then the film was spun dry at 2500 rpm for 10 second and then the film was removed from the chuck and subjected to heat treatment.

The film obtained from the above process was then heated at 175 and 320° C. under air for 60 seconds respectively. Then it was cured in a firnace at 400° C. for 30 minute under nitrogen. Refractive index of the obtained film was measured by Woollam ellipsometer. Dielectric constant was measured by the standard CV curve technique, using MOS capacitor structure at 1 MHz.

TABLE 2

| Refractive Index | Film Thickness (Angstroms) | Dielectric constant | Stud pull (KPSI) |
| --- | --- | --- | --- |
| 1.1665 | 7518 | 1.98 | 0.31 |

EXAMPLE 3

This example illustrates the preparation of a nanoporous silica dielectric film polymer coated with Acuglass™ 311.

A nanoporous silica precursor was synthesized by adding 208 mL of tetraethoxysilane, 94 mL of triethyleneglycol monomethyl ether(TIEGMME), 16.8 mL deionized water, and 0.68 mL of 1N nitric acid together in a round bottom flask. This solution was heated to about 80° C. with vigorous stirring. After refluxed for 1.5 hours to form a clear solution, this solution was allowed to cool down to room temperature. Then it was diluted 25% by weight with ethanol and filtered through 0.1 micron Teflon™ filter.

About 2 mL of the nanoporous silica precursor was deposited onto a 4" silicon wafer and then spun at 2500 rpm for 30 seconds. Then the film was gelled/aged in a vacuum chamber using the identical conditions shown by Example 1, above.

Surface Treatment/Solvent Exchange of Nanoporous Film

Next the aged film was subjected to surface treatment/ solvent exchange. Solution used for surface treatment/ solvent exchange was prepared by dissolving methyltriacetoxy (MTAS) in 3-pentanone (Pacific Pac International Inc., Hollister, Calif.) to make 5wt. % MTAS concentration in 3-pentanone. MTAS was purchased from United Chemical Technologies, Inc (Bristol, Pa.) and distilled prior to use. The surface treatment/solvent exchange of the film was carried out using the above reagent, and the process steps and conditions as described above for Example 1.

The film obtained from the above process was then heated at 175 and 320° C. under air for 60 seconds respectively.

Polymer Treatment

The baked film was subjected to the polymer solution treatment. A commercial spin-on glass 311 (AlliedSignal at Santa Clara, Calif.) is used for the surface treatment.

1. The baked film was put on the spinning chuck and spun at 0 rpm [this is a static application].
2. About 2 mL of the above Si-based polymer solution was dispensed on the film.

3. Then the film was spun at 250 rpm for 2 second and then raised the spin speed to 3000 rpm and spun for 20 seconds.

The film obtained from the above process was then heated at 80, 150 and 250° C. under air for 60 seconds respectively. Then it was cured in a firnace at 400° C. for 30 minutes under nitrogen.

Film Mechanical Strength Measurement

The cohesive strength of the film was measured by stud pull test. The film to be tested was placed on substrate wafer and an aluminum layer was placed on top of the film to prevent penetration of the epoxy into pore structure by the subsequently applied epoxy. An epoxy test stud was then epoxied to the top of the aluminized film. Once the epoxy was cured, the stud was pull away from the film until some component broke. The measured pull force at the moment just prior to breakage was reported as the stud pull strength measured in kilopounds per square inch (KPSI). The measured stud pull strength of this film is 5.8 KPSI.

EXAMPLE 4

Preparation of a nanoporous silica dielectric film coated with Accuglass™ 111.

A nanoporous silica precursor was synthesized by adding 208 mL of tetraethoxysilane, 94 mL of triethyleneglycol monomethyl ether(TIEGMME), 16.8 mL deionized water, and 0.68 mL of 1N nitric acid together in a round bottom flask. This solution was heated to about 80° C. with vigorous stirring. After refluxed for 1.5 hours to form a clear solution, this solution was allowed to cool down to room temperature. Then it was diluted 25% by weight with ethanol and filtered through 0.1 micron Teflon™ filter.

About 2 mL of the nanoporous silica precursor was deposited onto a 4" silicon wafer and then spun at 2500 rpm for 30 seconds. Then the film was gelled/aged in a vacuum chamber using the identical conditions as shown in Example 1, above.

Surface Treatment/Solvent Exchange of Nanoporous Film

The aged film was subjected to surface treatment/solvent exchange. Solution used for surface treatment/solvent exchange was prepared by dissolving methyltracetoxy (MTAS) in 3-pentanone (Pacific Pac International Inc., Hollister, Calif.) to make 5wt. % MTAS concentration in 3-pentanone. MTAS was purchased from United Chemical Technologies, Inc (Bristol, Pa.) and distilled prior to use. The surface treatment/solvent exchange of the film was carried out using the above reagent, and the process steps and conditions as described above for Example 1.

The film obtained from the above process was then heated at 175 and 320° C. under air for 60 seconds respectively.

Polymer Treatment

The baked film was subjected to the polymer solution treatment. A commercial spin-on glass 111 (AlliedSignal at Santa Clara, Calif.) is used for the surface treated.

1. The baked film was put on the spinning chuck and spun at 0 rpm [this is a static application].
2. About 2 mL of the above Si-based polymer solution was dispensed on the film.
3. Then the film was spun at 250 rpm for 2 second and then raised the spin speed to 3000 rpm and spun for 20 seconds.

The film obtained from the above process was then heated at 80, 150 and 250° C. under air for 60 seconds respectively. Then it was cured in a furnace at 400° C. for 30 minutes under nitrogen.

Film Mechanical Strength Measurement

The cohesive strength of the film was measured by stud pull test. The film to be tested was placed on substrate wafer and an aluminum layer was placed on top of the film to prevent penetration of the epoxy into pore structure by the subsequently applied epoxy. An epoxy test stud was then epoxied to the top of the aluminized film. Once the epoxy was cured, the stud was pull away from the film until some component broke. The measured pull force at the moment just prior to breakage was reported as the stud pull strength measured in kilopounds per square inch (KPSI).

Refractive index of the obtained film was measured by Woollam ellipsometer. Dielectric constant was measured by the standard CV curve technique, using MOS capacitor structure at 1 MHz.

TABLE 3

| Refractive Index | Film Thickness (Angstroms) | Dielectric constant | Stud pull (KPSI) |
|---|---|---|---|
| 1.237 | 8221 | 3.06 | 3.2 |

EXAMPLE 5

This example illustrates the preparation of a nanoporous dielectric silica film coated with LOSP™ spin-on-glass.

A nanoporous silica precursor was synthesized by adding 208 mL of tetraethoxysilane, 94 mL of triethyleneglycol monomethyl ether(TIEGMME), 16.8 mL deionized water, and 0.68 mL of 1N nitric acid together in a round bottom flask. This solution was heated to about 80° C. with vigorous stirring. After refluxed for 1.5 hours to form a clear solution, this solution was allowed to cool down to room temperature. Then it was diluted 25% by weight with ethanol and filtered through 0.1 micron Teflon™ filter.

About 2 mL of the nanoporous silica precursor was deposited onto a 4" silicon wafer and then spun at 2500 rpm for 30 seconds. Then the film was gelled/aged in a vacuum chamber using the identical conditions shown by Example 1, above.

Next the aged film was subjected to surface treatment/ solvent exchange. Solution used for surface treatment/ solvent exchange was prepared by dissolving methyltrracetoxy (MTAS) in 3-pentanone (Pacific Pac International Inc., Hollister, Calif.) to make 5 wt. % MTAS concentration in 3-pentanone. MTAS was purchased from United Chemical Technologies, Inc (Bristol, Pa.) and distilled prior to use. The surface treatment/solvent exchange of the film was carried out using the above reagent, and the process steps and conditions as described above for Example 1.

The film obtained from the above process was then heated at 175 and 320° C. under air for 60 seconds respectively.

Polymer Treatment

Then this baked film was subjected to the polymer solution treatment. An experimental spin-on glass LOSP™ (5% in methyl isobutylketone from AlliedSignal at Santa Clara, Calif.) is used for the surface treated.

1. The baked film was put on the spinning chuck and spun at 0 rpm [this is a static application].
2. About 2 mL of the above Si-based polymer solution was dispensed on the film.
3. Then the film was spun at 250 rpm for 2 second and then raised the spin speed to 3000 rpm and spun for 20 seconds.

The film obtained from the above process was then heated at 80, 150 and 250° C. under air for 60 seconds respectively.

Then it was cured in a furnace at 400° C. for 30 minutes under nitrogen.

Film Mechanical Strength Measurement

The cohesive strength of the film was measured by stud pull test. The film to be tested was placed on substrate wafer and an aluminum layer was placed on top of the film to prevent penetration of the epoxy into pore structure by the subsequently applied epoxy. An epoxy test stud was then epoxied to the top of the aluminized film. Once the epoxy was cured, the stud was pull away from the film until some component broke. The measured pull force at the moment just prior to breakage was reported as the stud pull strength measured in kilopounds per square inch (KPSI). The stud pull of this film measured by this technique is 1.6 KPSI.

EXAMPLE 6

This example illustrates the preparation of a nanoporous dielectric silica film coated with Flare™ spin-on-glass.

A nanoporous silica precursor was synthesized by adding 208 mL of tetraethoxysilane, 94 mL of triethyleneglycol monomethyl ether(TIEGMME), 16.8 mL deionized water, and 0.68 mL of 1N nitric acid together in a round bottom flask. This solution was heated to about 80° C. with vigorous stirring. After refluxed for 1.5 hours to form a clear solution, this solution was allowed to cool down to room temperature. Then it was diluted 25% by weight with ethanol and filtered through 0.1 micron Teflon™ filter.

About 5 mL of the nanoporous silica precursor was deposited onto a 8" silicon wafer and then spun at 2500 rpm for 60 seconds. Then the film was gelled/aged in a vacuum chamber using the identical conditions shown by Example 1, above.

Surface Treatment/Solvent Exchange of Nanoporous Film

Next the aged film was subjected to surface treatment/ solvent exchange. Solution used for surface treatment/ solvent exchange was prepared by dissolving methyltrracetoxy (MTAS) in 3-pentanone (Pacific Pac International Inc., Hollister, Calif.) to make 5 wt. % MTAS concentration in 3-pentanone. MTAS was purchased from United Chemical Technologies, Inc (Bristol, Pa.) and distilled prior to use. The surface treatment/solvent exchange of the film was carried out using the above reagent, and the process steps and conditions as described above for Example 1.

Then the film was spun dry at 2500 rpm for 10 second and then the film was removed from the chuck and subjected to heat treatment.

The film obtained from the above process was then heated at 175 and 320° C. under air for 60 seconds respectively.

Polymer Treatment

The baked film was subjected to the polymer solution treatment. A experimental spin-on dielectric Flare™ (4% in cyclohexanone from AlliedSignal at Santa Clara, Calif.) was employed.

1. The baked film was put on the spinning chuck and spun at 0 rpm [this is a static application].
2. About 5 mL of the above Flare polymer solution was dispensed on the film.
3. Then the film was spun at 500 rpm for 5 second and then stopped for 45 seconds, then the films was spun at 2000 rpm for 60 seconds.

The film obtained from the above process was then heated at 150, 200, 250° C. under nitrogen for 60 seconds respectively. Then it was cured in a furnace at 400° C. for 60 minutes under nitrogen.

Film Mechanical Strength Measurement

The cohesive strength of the film was measured by stud pull test. The film to be tested was placed on substrate wafer and an aluminum layer was placed on top of the film to prevent penetration of the epoxy into pore structure by the subsequently applied epoxy. An epoxy test stud was then epoxied to the top of the aluminized film. Once the epoxy was cured, the stud was pull away from the film until some component broke. The measured pull force at the moment just prior to breakage was reported as the stud pull strength measured in kilopounds per square inch (KPSI). The stud pull of this film measured by this technique is 5 KPSI.

EXAMPLE 7

This example demonstrates that a nanoporous silica film can be prepared and then solvent exchanged and treated with a LOSP™ Si-based polymer to provide a pore surface having both SiC and SiH bonds.

Methods

1. The precursor was synthesized by adding 104.0 mL of tetraethoxysilane (Pacific Pac, Hollister, Calif. 95023), 51.0 mL of Triethylene glycol mono methyl ether (TriEGMME) (Pacific Pac, Hollister, Calif. 95023), 8.4 mL of deionized water, and 0.34 mL of 1N nitric acid (J.T. Baker, Phillipsburg, N.J. 06885) together in a round bottom flask. The solution was allowed to mix vigorously then heated to 80° C. and refluxed for 1.5 hours to form a solution. After the solution was allowed to cool to room temperature, it was stored in refrigeration at 4° C. The solution was then diluted 25% by weight with ethanol (Ricca Chemical Company, Arlington, Tex. 76012) to reduce the viscosity. The diluted precursor was filtered to 0.1 μm using a Teflon™ filter.
2. Approximately 8.0–10.0 ml of the precursor was deposited onto an 8" inch silicon wafer, and spun at 2500 rpm for 30 seconds.
3. The film was gelled and aged in a vacuum chamber using the following conditions:
    1) The chamber was evacuated to −20 "Hg. 2) Next, 15M ammonium hydroxide (Aldrich Chemical Company, Milwaukee, Wis. 53201) was heated and equilibrated at 45° C. and dosed into the chamber to increase the pressure to −4.0 "Hg for 3 minutes. 3) Finally, the chamber was evacuated to −20.0 "Hg and backfilled with air.
4. The film was then solvent exchanged with a 5% (by wt.) mixture of methyltriacetoxysilane (MTAS) (Gelest Inc., Tullytown, Pa. 19007) in 3-pentanone (Aldrich Chemical Company, Milwaukee, Wis. 53201) was mixed together. Approximately 20–30 mls of this mixture was deposited on the film while spinning at 250 rpm's for 20 seconds without allowing the film to dry. The film was then spun dry at 1000 rpm for 5 seconds.
5. The film was heated at elevated temperatures for 1 min. each at 175° C. and 320° C. in air, the films were allowed to cool to ambient temperature, loaded into a quartz wafer holder and then inserted into a vertical tube firnace. The samples in the furnace were kept under $N_2$ gas with a flow rate of 67 liters/min. The temperature in the furnace was initially at about 150° C., and then ramped to 400° C. at a rate of 20° C. per min. Once the temperature reached 400° C., the films were held at that temperature for 0.5 hr. This yielded 5,000–6,000 Å films.
6. A low organic siloxane polymer produced by Allied-Signal Advanced Microelectronic Materials' (Sunnyvale, Calif.) named LOSP™ that contains a silicon-oxygen backbone was deposited on top of the film at 3000 rpm for 20 sec. This polymer contains 3 oxygen atoms on every silicon atom while the remaining valence state has approximately 40 percent of an alkyl group and 60 percent hydrogen.

7. The new film was heated at 150° C., 200° C., and 350° C. for 1 min each, cooled to ambient temperature, and then loaded into a quartz wafer holder and inserted into a vertical tube furnace where they were kept under $N_2$ gas with a flow rate of 67 liters/min. As described above, the temperature in the furnace was initially at about 150° C., and was then ramped to 400° C. at a rate of 20° C. per min. The films were then held at 400° C. for 0.5 hr.

Results

The produced film was then characterized using Fourier transform infrared ("FTIR"), scanning electron microscopy ("SEM") cross-section, inspection of cracking/adhesion with light microscopy ("LM").

The FTIR spectra (not shown) demonstrated that after solvent exchange absorbance peaks were present in the produced film at C—H (2970 cm-1), Si—H (2250 cm-1), and Si—C (1270cm-1), thus confirming that the film contained the desired proportion of C—H, Si—H and Si—C bonds. In addition, LM observations confirmed that the tested film appeared to be crack free when observed at lower magnifications. The SEM cross-sections showed no interlayer cracking, and good adhesion of the film to the substrate.

EXAMPLE 8

This example demonstrates that a nanoporous silica film can be prepared, solvent exchanged and coated with OPX™ Si-based polymer, so that at the pore surface consists primarily of SiH bonds.

1. The precursor was synthesized by adding 104.0 mL of tetraethoxysilane (Pacific Pac, Hollister, Calif. 95023), 51.0 mL of Triethylene glycol mono methyl ether (TriEGMME) (Pacific Pac, Hollister, Calif. 95023), 8.4 mL of deionized water, and 0.34 mL of 1N nitric acid (J.T. Baker, Phillipsburg, N.J. 06885) together in a round bottom flask. The solution was allowed to mix vigorously then heated to 80° C. and refluxed for 1.5 hours to form a solution. After the solution was allowed to cool to room temperature, it was stored in refrigeration at 4° C. The solution was then diluted 25% by weight with ethanol (Ricca Chemical Company, Arlington, Tex. 76012) to reduce the viscosity. The diluted precursor was filtered to 0.1 μm using a Teflon™ filter.
2. Approximately 8.0–10.0 ml of the precursor was deposited onto an 8" inch silicon wafer, and spun at 2500 rpm for 30 seconds.
3. The film was gelled and aged in a vacuum chamber using the following conditions:
   1) The chamber was evacuated to −20 "Hg. 2) Next, 15M ammonium hydroxide (Aldrich Chemical Company, Milwaukee, Wis. 53201) was heated and equilibrated at 45° C. and dosed into the chamber to increase the pressure to 4.0 "Hg for 3 minutes. 3) Finally, the chamber was evacuated to −20.0 "Hg and backfilled with air.
4. The film was then solvent exchanged with a 5% (by wt.) mixture of Methyltriacetoxysilane (MTAS) (Gelest Inc., Tullytown, Pa. 19007) in 3-pentanone (Aldrich Chemical Company, Milwaukee, Wis. 53201) was mixed together. Approximately 20–30 mls of the mixture was deposited on the film while spinning at 250 rpm's for 20 seconds without allowing the film to dry. The film was then spun dry at 1000 rpm for 5 seconds.
5. The film was heated at elevated temperatures for 1 min. each at 175° C. and 320° C. in air, cooled to ambient temperature, and then loaded into a quartz wafer holder and inserted into a vertical tube furnace where they were kept under $N_2$ gas with a flow rate of 67 liters/min. As described above, the temperature in the furnace was initially at about 150° C., and was then ramped to 400° C. at a rate of 20° C. per min. The films were then held at 400° C. for 0.5 hr. This yielded 5,000 to 6000 Å thick films.

A polymer produced by AlliedSignal named OPX™ (an oxygen plasma resistant hydridosilsesquioxane) was deposited on top of the film at 3000 rpm for 20 sec. This polymer mostly contains 1 hydrogen for every silicon atom while the remaining valence states have oxygen atoms.

6. The new film was heated at 80° C., 150° C., and 200° C. for 1 min each, cooled to ambient temperature, and then loaded into a quartz wafer holder and inserted into a vertical tube furnace where they were kept under $N_2$ gas with a flow rate of 67 liters/min. As described above, the temperature in the furnace was initially at about 150° C., and was then ramped to 400° C. at a rate of 20° C. per min. The films were then held at 400° C. for 0.5 hr.

Results

The treated films were tested by FTIR, LM and SEM, as for Example 7, above.

As for the products of Example 7, the FTIR spectra showed a peak in the regions of: C—H (2970 cm-1), S—H (2250 cm-1), and Si—C (1270 cm-1). The film appeared to be crack free at lower LM magnifications. The SEM cross-sections showed no interlayer cracking, and good adhesion of the film to the substrate.

EXAMPLE 9

This example demonstrates that a nanoporous silica film can be prepared, solvent exchanged and coated with HOSP™ Si-based polymer, so that the pore surface contains primarily SiC and SiH bonds.

1. The precursor was synthesized by adding 104.0 mL of tetraethoxysilane (Pacific Pac, Hollister, Calif. 95023), 51.0 mL of Triethylene glycol mono methyl ether (TriEGMME) (Pacific Pac, Hollister, Calif. 95023), 8.4 mL of deionized water, and 0.34 mL of 1N nitric acid (J.T. Baker, Phillipsburg, N.J. 06885) together in a round bottom flask. The solution was allowed to mix vigorously then heated to ~80° C. and refluxed for 1.5 hours to form a solution. After the solution was allowed to cool to room temperature, it was stored in refrigeration at 4° C. The solution was then diluted 25% by weight with ethanol (Ricca Chemical Company, Arlington, Tex. 76012) to reduce the viscosity. The diluted precursor was filtered to 0.1 μm using a Teflon™ filter.
2. Approximately 8.0–10.0 ml of the precursor was deposited onto an 8" inch silicon wafer, and spun at 2500 rpm for 30 seconds.
3. The film was gelled and aged in a vacuum chamber using the following conditions:
   1) The chamber was evacuated to −20 "Hg. 2) Next, 15M ammonium hydroxide (Aldrich Chemical Company, Milwaukee, Wis. 53201) was heated and equilibrated at 45° C. and dosed into the chamber to increase the pressure to −4.0 "Hg for 3 minutes. 3) Finally, the chamber was evacuated to −20.0 "Hg and backfilled with air.

4. The film was then solvent exchanged with a 5% (by wt.) mixture of Methyltriacetoxysilane (MTAS) (Gelest Inc., Tullytown, Pa. 19007) in 3-pentanone (Aldrich Chemical Company, Milwaukee, Wis. 53201) was mixed together. Approximately 20–30 mils of the mixture was deposited on the film while spinning at 250 rpm's for 20 seconds without allowing the film to dry. The film was then spun dry at 1000 rpm for 5 seconds.

5. The film was heated at elevated temperatures for 1 min. each at 175° C. and 320° C. in air, cooled to ambient temperature, and then loaded into a quartz wafer holder and inserted into a vertical tube furnace where they were kept under $N_2$ gas with a flow rate of 67 liters/min. As described above, the temperature in the furnace was initially at about 150° C., and was then ramped to 400° C. at a rate of 20° C. per min. The films were then held at 400° C. for 0.5 hr. This yielded 5,000 to 6000 Å thick films.

6. A high organic siloxane polymer produced by Allied-Signal Advanced Microelectronic Materials' (Sunnyvale, Calif.) named HOSP™ that contains a silicon oxygen backbone was deposited on top of the film at 3000 rpm for 20 sec. This polymer contains 3 oxygen atoms on every silicon atom while the remaining valence state has approximately 60 percent of an alkyl group and 40 percent hydrogen.

7. The new film was heated at 150° C., 200° C., and 350° C. for 1 min each. It was then cured at 400° C. ramped program for 0.5 hr with nitrogen.

8. The film was characterized using FTI, SEM cross-section, inspection of cracking/adhesion by LM, and water droplet penetration.

What is claimed is:

1. A surface-coated nanoporous silica dielectric film that is prepared by a process comprising the steps of forming a nanoporous silica dielectric coating on a substrate, and coating the formed nanoporous silica dielectric coating with a coating composition comprising a polymer, under conditions effective to form a layer on said nanoporous silica dielectric coating.

2. The surface-coated nanoporous silica dielectric film of claim 1, wherein the nanoporous silica dielectric coating is prepared from a spin-on-glass material comprising at least one compound selected from the group consisting of an alkoxysilane, alkylalkoxysilane, a silsesquioxane, a hydrogensiloxane, a hydroorganosiloxane, a hydrogensilsesquioxane, an acetoxysilane, a halogenated silane and combinations thereof.

3. The surface-coated nanoporous silica dielectric film of claim 1 that is prepared by a process wherein the coating composition comprises a compound that is selected from the group consisting of a low organic siloxane, a high organic siloxane, a hydridoorganosiloxane, a poly(arylene ether), a fluorinatated poly(arylene) ether, a polyimide, a polycarbosilane, and combinations thereof.

4. The surface-coated nanoporous silica dielectric film of claim 1 that is prepared by a process wherein the coating composition is applied to the formed nanoporous silica dielectric coating before the nanoporous silica dielectric coating is cured, and then curing the nanoporous dielectric coating and the coating composition is simultaneously.

5. The surface-coated nanoporous silica dielectric film of claim 2 wherein the nanoporous silica dielectric coating is prepared from a spin-on-glass material comprising alkoxysilane.

6. The surface-coated nanoporous silica dielectric film of claim 5 wherein the nanoporous silica dielectric coating is prepared from a spin-on-glass material comprising tetraethoxysilane.

7. The surface-coated nanoporous silica dielectric film of claim 3 that is prepared by a process wherein the coating composition comprises at least one low organic compound that is selected from the group consisting of

  Formula 2

  Formula 3

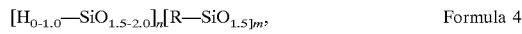  Formula 4

  Formula 5 and combinations thereof;
wherein the sum of n and m, ranges from about 8 to about 5000;
the sum or x, y and z ranges from about 8 to about 5000; and
m and y are selected such that carbon containing substituents are present in an amount of less than about 40 mole percent.

8. The surface-coated nanoporous silica dielectric film of claim 7 that is prepared by a process wherein R is organic and is independently selected from the group consisting of straight chain alkyl, branched alkyl, cycloalkyl, aryl groups, and mixtures thereof.

9. The surface-coated nanoporous silica dielectric film of claim 3 that is prepared by a process wherein the coating composition comprises at least one compound that is selected from the group consisting of

  Formula 6

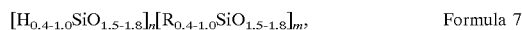  Formula 7

  Formula 8

  Formula 9 and combinations thereof;
wherein the sum of n and m ranges from about 8 to about 5000,
m is selected such that the carbon containing substituent is present in an amount ranging from about 40 Mole percent or greater;
wherein the sum of x, y and z ranges from about 8 to about 5000; and
y is selected such that the carbon containing substituent is present in an amount of about 40 Mole % or greater.

10. The surface-coated nanoporous silica dielectric film of claim 9 that is prepared by a process wherein R is organic and is independently selected from the group consisting of straight chain alkyl, branched allyl, cycloalkyl, aryl groups, and mixtures thereof.

11. The surface-coated nanoporous silica dielectric film of claim 3 that is prepared by a process wherein the coating composition comprises at least one compound with the formula:

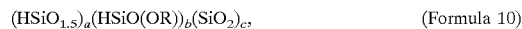  (Formula 10)

wherein R is a mixture of H and an alkyl group having between 1 and 4 carbon atoms; and a+b+c=1; 0.5<a<0.99; 0.01<b<0.5; and 0<c<0.5.

12. The surface-coated nanoporous silica dielectric film of claim 3 that is prepared by a process wherein the coating composition comprises at least one polycarbosilane that is selected from the group consisting of —[Si(R$_1$)(R$_2$)(H)]$_x$—, —[Si(R$_3$)(R$_4$)]$_y$—, —[Si(R$_5$)(R$_7$)(O—R$_6$)]$_z$—, —[Si(R$_8$)(R$_9$)(R$_{10}$)]$_w$—;

wherein R$_1$, R$_7$ and R$_{10}$ is each independently selected from the group consisting of an alkylene, cycloalkylene and arylane group, and is substituted or unsubstituted, R$_2$, R$_3$, R$_4$, R$_5$ and R$_6$ is each independently selected from a group consisting of an H and organic group, R$_6$ is selected from a group consisting of an organosilicon, a silanyl, a siloxyl, and an organo group; and $10<x+y+z+w<100,000$, and y and z and w can collectively or independently be zero.

13. The surface-coated nanoporous silica dielectric film of claim 1 that exhibits the following measured properties, Si—H bond absorbance at 2150 cm$^{-1}$ measured by Fourier transform infrared spectroscopy, stud pull strength ranging from about 1.5 kpsi to about 6 kpsi, and wherein the pore structures remain open.

14. An integrated circuit device comprising the surface-coated nanoporous silica dielectric film prepared according to claim 1.

15. A method of preparing a surface-coated nanoporous silica dielectric film comprising the steps of forming a nanoporous silica dielectric coating on a substrate, and coating the formed nanoporous silica dielectric coating with a coating composition comprising a polymer, under conditions effective to form a polymer layer on said nanoporous silica dielectric coating.

16. The method of claim 15, wherein the nanoporous silica dielectric film is prepared by applying a spin-on-glass film on a substrate, and then gelling said film to form a nanoporous silica dielectric coating.

17. The method of claim 15 wherein the coating composition comprises a polymer that is selected from the group consisting of a low organic siloxane, a high organic siloxane, a hydridoorganosiloxane, a poly(arylene ether), a fluorinated poly(arylene)ether, a polyimide, a polycarbosilane, and combinations thereof.

18. The method of claim 15 comprising applying the coating composition to the formed nanoporous silica dielectric coating and then curing the nanoporous dielectric coating and the coating composition simultaneously.

19. A surface-coated nanoporous silica dielectric film prepared by the method of claim 15.

* * * * *